(12) United States Patent
Kanschat et al.

(10) Patent No.: US 9,891,247 B2
(45) Date of Patent: Feb. 13, 2018

(54) U-SHAPED VERTICAL SHUNT RESISTOR FOR POWER SEMICONDUCTOR MODULE

(71) Applicant: Infineon Technologies AG, Neubiberg (DE)

(72) Inventors: Peter Kanschat, Soest (DE); Thilo Stolze, Arnsberg (DE)

(73) Assignee: Infineon Technologies AG, Neubiberg (DE)

(*) Notice: Subject to any disclaimer, the term of this patent is extended or adjusted under 35 U.S.C. 154(b) by 482 days.

(21) Appl. No.: 14/497,437

(22) Filed: Sep. 26, 2014

(65) Prior Publication Data

US 2015/0091551 A1  Apr. 2, 2015

(30) Foreign Application Priority Data

Sep. 27, 2013 (DE) .................. 10 2013 219 571

(51) Int. Cl.
*G01R 1/20* (2006.01)
*G01R 19/00* (2006.01)
*H01C 17/00* (2006.01)
*H01C 1/144* (2006.01)

(52) U.S. Cl.
CPC ......... *G01R 1/203* (2013.01); *G01R 19/0092* (2013.01); *H01C 1/144* (2013.01); *H01C 17/00* (2013.01); *H01L 2224/48227* (2013.01); *H01L 2224/48472* (2013.01); *H01L 2224/49107* (2013.01); *H01L 2924/13055* (2013.01); *Y10T 29/49082* (2015.01)

(58) Field of Classification Search
CPC ... G01R 1/203; G01R 19/0092; H01L 25/105; H01L 35/32; G01N 27/403; H01C 7/06; H01C 7/10; H01C 17/00; Y10T 29/49082

USPC ........ 324/200, 126, 76.11, 207.21, 222, 500, 324/525, 549, 691
See application file for complete search history.

(56) References Cited

U.S. PATENT DOCUMENTS

| 5,287,083 A | 2/1994 | Person et al. |
| 6,622,374 B1* | 9/2003 | Wang ................. H01C 7/18 29/610.1 |
| 2011/0310568 A1* | 12/2011 | Hong ............... G01R 1/203 361/737 |
| 2014/0077345 A1* | 3/2014 | Uno ................ H01L 23/3135 257/664 |

FOREIGN PATENT DOCUMENTS

| CN | 1437201 A | 8/2003 |
| CN | 102364345 A | 2/2012 |

* cited by examiner

*Primary Examiner* — Melissa Koval
*Assistant Examiner* — Trung Nguyen
(74) *Attorney, Agent, or Firm* — Murphy, Bilak & Homiller, PLLC

(57) ABSTRACT

A measurement resistor for current measurement is described. According to one exemplary embodiment, the measurement resistor includes a first and a second metal layer, an electrically insulating interlayer and a resistive layer. The first metal layer is arranged in a first plane. The second metal layer is arranged in a second plane that is essentially parallel to the first plane and separated from the first plane. The electrically insulating interlayer is arranged between the first and second metal layers and mechanically connects the first and second metal layers to one another. The resistive layer electrically connects the first and second metal layers to one another.

16 Claims, 3 Drawing Sheets

U-SHAPED VERTICAL SHUNT RESISTOR FOR POWER SEMICONDUCTOR MODULE

PRIORITY CLAIM

This application claims priority to German Patent Application No. 10 2013 219 571.0, filed on 27 Sep. 2013, the content of said German application incorporated herein by reference in its entirety.

TECHNICAL FIELD

The invention relates to the field of current measurement with the aid of measurement resistors (shunt resistors), in particular to the structure of a measurement resistor and its integration into a power semiconductor module.

BACKGROUND

Power semiconductor components, and power electronic circuits constructed therefrom, are very often integrated into so-called power semiconductor modules (or power electronic modules). For example, power electronic converters (for example frequency converters, power inverters, etc.) may be integrated in a power semiconductor module. Power electronic converters constructed with the aid of power transistors (for example MOSFETs or IGBTs) may, for example, be used to drive electric motors. Another application involves inverters which, for example, convert direct current from solar plants into alternating current, so that the latter can be fed into the public power grid. Not only in these applications may current measurement in the load current paths be desirable. When driving electric motors, the motor torque may, for example, be determined from the measured current.

One very simple way of measuring current is to pass the load current to be measured through a measurement resistor (shunt resistor) with a known resistance, and to measure the resulting voltage drop across the measurement resistor. This voltage drop is proportional to the current of interest. In the case of high powers (for example more than 20 kW for electric motors in electrical vehicles), very heavy currents occur (for example up to 100 A or more) and the measurement resistors must be kept with very low resistance (for example in the range of a few milliohms) in order to be able to keep the power loss as small as possible. Since the temperature of the measurement resistor may vary because of the power loss dissipated in the measurement resistor, a low temperature gradient of the resistance is desirable for such measurement resistors. It may be advantageous nevertheless to cool the measurement resistors in order to keep the temperature in a defined range. When the measurement resistors are built into the power semiconductor module, sufficient cooling is normally ensured since during operation the module generally in any case is coupled to a cooling system. Known measurement resistors which are suitable for being built into a power semiconductor module, and for measuring heavy currents, are relatively large and occupy significant space in the module.

SUMMARY

A measurement resistor is provided for heavy currents, which can be integrated very compactly into a power semiconductor module.

A first aspect of the invention relates to a measurement resistor for current measurement. According to one exemplary embodiment of the invention, the measurement resistor comprises a first and a second metal layer, an electrically insulating interlayer and a resistive layer. The first metal layer is arranged in a first plane. The second metal layer is arranged in a second plane that is essentially parallel to the first plane and is separated therefrom. The electrically insulating interlayer is arranged between the first and second metal layers and mechanically connects them to one another. The resistive layer electrically connects the first and second metal layers to one another.

Another aspect of the invention relates to a method for producing a measurement resistor. According to one example of the invention, the method comprises the provision of an approximately U-shaped structure, two approximately parallel branches of the U-shape forming two metal layers separated from one another and parallel to one another, which are electrically connected to one another by means of a resistive layer. An interlayer made of insulating material is arranged between the parallel branches of the U-shape, so that the insulating material mechanically connects the two parallel branches of the U-shape.

According to another aspect of the invention, the method comprises the provision of a power electronic substrate having an insulation carrier made of ceramic or electrically insulated metal and metalization on both sides. A resistive layer is fixed on a side surface of the power electronic substrate, so that this layer electrically connects the two metalizations.

Another aspect of the invention relates to a power semiconductor module comprising a power electronic substrate having a structured metalization, which comprises a plurality of contact pads, as well as at least one electronic component arranged on the power electronic substrate, and a measurement resistor. The measurement resistor comprises a first metal layer, which is arranged on one of the contact pads of the structured metalization and is mechanically and electrically connected thereto, and a second metal layer, which is arranged in a plane parallel to the structured metalization and separated therefrom. An electrically insulating interlayer is arranged between the first and second metal layers and mechanically connects them to one another. A resistive layer ensures electrical connection of the first metal layer to the second metal layer. The main current direction through the measurement resistor is essentially perpendicular to the plane in which the structured metalization of the power electronic substrate lies. A further aspect of the invention relates to a method for producing such a power semiconductor module.

BRIEF DESCRIPTION OF THE DRAWINGS

The invention will be explained in more detail below with the aid of examples represented in the drawings. The representations are not necessarily true to scale, and the invention is not restricted merely to the aspects represented. Rather, emphasis is placed on representing the underlying principles of the invention. In the drawings.

DETAILED DESCRIPTION

Figure 1:
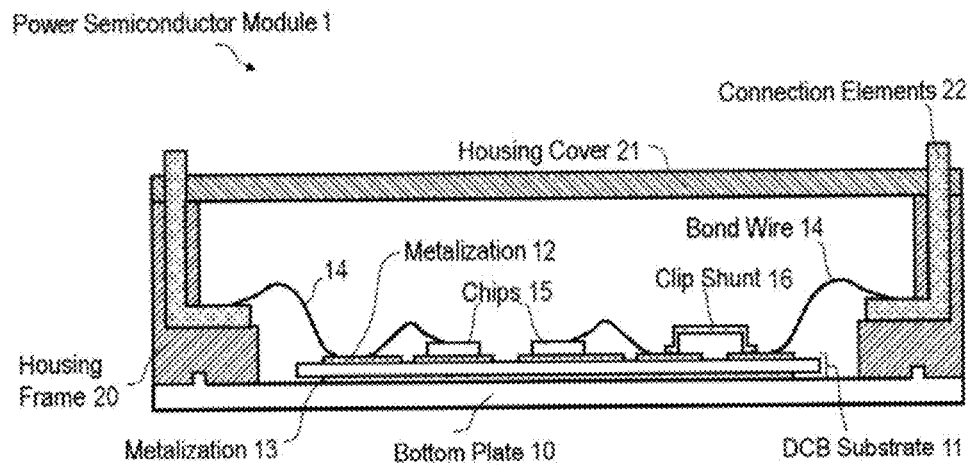
FIG. 1 shows an example of a power semiconductor module (in cross-sectional representation) having an integrated measurement resistor.

In the figures, references which are the same denote components which are the same or similar, respectively with the same meaning or a similar meaning. Individual technical features of the various exemplary embodiments may generally—in so far as is technically feasible and sensible—be combined with features of other exemplary embodiments, unless otherwise explicitly mentioned.

First, with reference to the schematic representation shown in FIG. 1, an example of a power semiconductor module 1 will be described very generally. The power semiconductor module 1 comprises a flat base plate 10, which forms the housing bottom of the module housing and is therefore also referred to as a bottom plate. The module housing may consist of a plurality of parts, and in the present example furthermore comprises a housing frame 20, which forms the side walls of the module housing, as well as a housing cover 21. Depending on the embodiment, the module frame 20 and the housing cover 21 may be formed in one piece.

The module 1 comprises at least one power electronic substrate 11. Each substrate 11 has, for example, a dielectric insulation carrier with high thermal conductivity, which is provided with an upper metalization 12 and with an optional lower metalization 13. The insulation carrier is used to electrically insulate the upper metalization 12 from the bottom plate 10. The power electronic substrate 11 may, in particular, be a DCB substrate (DCB=direct copper bonded), a DAB substrate (DAB=direct aluminum bonded) or an AMB substrate (AMB=active metal braze), in which the insulation carrier 20 usually consists of ceramic. A further power electronic substrate is the so-called IMS substrate (IMS=insulated metal substrate), in which a metallic carrier is insulated from the metalization 12 by a thin insulation layer. The upper metalization 12 is structured, and therefore comprises conductive tracks, contact pads (for example solder pads, bond pads, etc.) and the like. Power electronic substrates are used inter alia as carriers for semiconductor chips, and are not to be confused with semiconductor substrates (for example silicon wafers), which are used as base material for the semiconductor chips.

One or more power semiconductor chips 15 are arranged on the power electronic substrate 11. These are usually chips without packages, so-called "bare dies". In the exemplary embodiment according to FIG. 1, each of the power semiconductor chips 15 may comprise a controllable power semiconductor switch, for example an IGBT (insulated gate bipolar transistor), a MOSFET (metal oxide semiconductor field effect transistor), a JFET (junction field effect transistor), a thyristor, a diode, etc. The number and type of the power semiconductor chips 15, which generate heat loss, arranged on the power electronic substrate 11 is arbitrary, however, and depends on the respective application. For the power electronic converters mentioned in the introduction, transistor half-bridges constructed with the aid of MOSFETs or IGBTs are often used.

The power semiconductor chips 15 may be connected mechanically, as well as electrically conductively, to contact pads of the upper metalization 12, for example by means of soldering or sintering. The upper sides of the semiconductor chips 15 may be electrically connected to corresponding bond pads of the metalization 12, for example with the aid of bond wires 14.

In order to permit sufficient cooling of the power semiconductor chips 15, one important property of the insulation carrier is a low thermal resistance. It is therefore desirable for the material and the thickness of the substrate to be adapted to the requirements of the power semiconductor module 1. The bottom plate 10 may comprise an electrically conductive metal plate (for example made of copper or aluminum), or consist thereof. Optionally, the bottom plate 10 is provided on its surface with a thin material layer, for example of nickel, which is used to improve the solderability of the bottom plate 10. The power electronic substrate 11 may be connected to the base plate 10, for example by soft soldering. Power semiconductor modules may also be produced without a base plate 10. In the case of such modules without bottom plates, the substrate 11 replaces the bottom plate and directly forms the housing bottom of the module.

In general, the power semiconductor module 1 comprises a number of connection elements 22 (often rectangular in cross section), which allow an electrical connection of the module 1 to other components, for example voltage supply units, intermediate circuit capacitors, electrical machines, other power semiconductor modules and/or control unit. In the present example, the connection elements 22 are fed through the housing frame 20. As an alternative, the connection elements may also be fed through the housing cover. Inside the module housing 20, 21, the connection elements 22 are electrically connected to the upper metalization 12 and/or to one or more of the power semiconductor chips 15. This connection may be established in various ways. In the present example, the connection elements 22 each have a bond pad at their lower end, and the connection elements 22 are respectively connected by means of a bond wire 14 to a corresponding bond pad on the power electronic substrate 11 or on a semiconductor chip 15. Other connection techniques are however also possible, for example jack connectors, spring contacts, etc.

In the representation shown in FIG. 1 by way of example, a measurement resistor 16 is also represented. This measurement resistor has a so-called clip shape (bridge shape), i.e. it approximately has the shape of a U-profile (or of a C-profile) with solder pads on the lateral branches of the U-shape. The measurement resistor 16 may, for example, be connected to two neighboring contact pads of the metalization 12 by means of soldering, the respective contact pads again being connected with the aid of bond wires 14 to other components (for example a chip 15 or a connection element 22).

Figure 2:
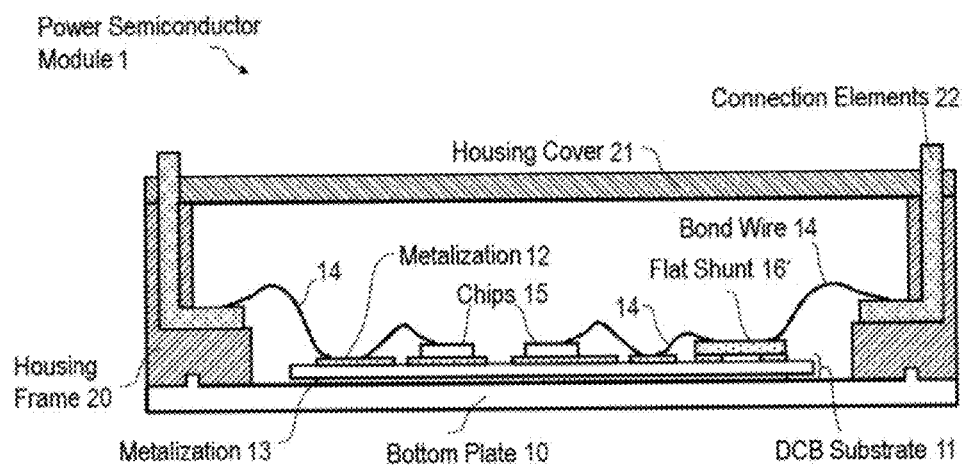
FIG. 2 shows a power semiconductor module as in FIG. 1, but with a measurement resistor having a different type of structure.

The example represented in FIG. 2 is—apart from the structure of the measurement resistor 16—identical to the example of FIG. 1. The measurement resistor 16' used in the present example has a flat shape (for example with a rectangular cross section) and is likewise connected at its two ends to associated contact pads of the metalization 12. In order to save some space, the measurement resistor 16' has bond pads at both ends on its upper side, in order to be able to contact the measurement resistor 16 directly with the aid of bond wires 14.

In both examples (FIG. 1 and FIG. 2), the load current essentially flows parallel to the surface of the substrate 11 through the measurement resistor 16 or 16', which entails a certain lateral extent of the measurement resistor and requires significant space on the substrate.

Figure 3:
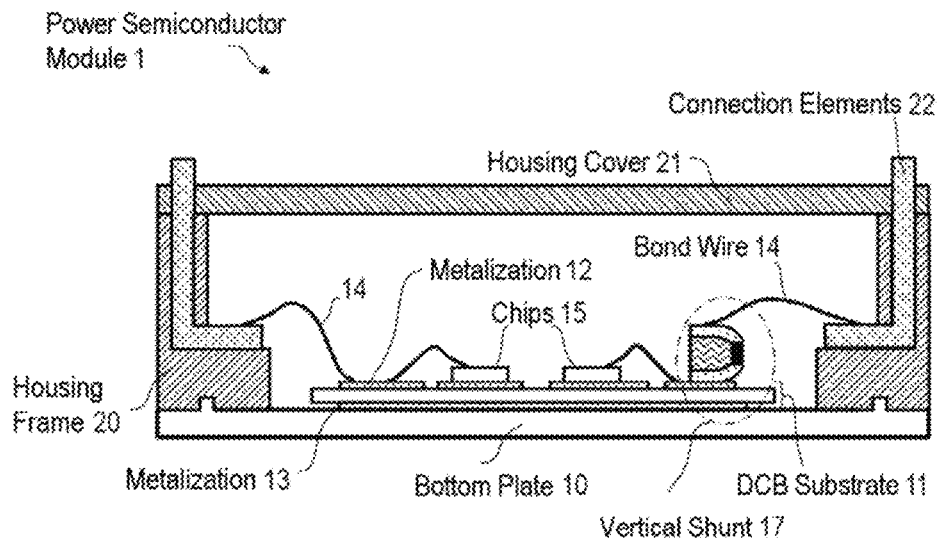
FIG. 3 shows a further example of a power semiconductor module having a measurement resistor according to one exemplary embodiment of the invention.
Figure 4:
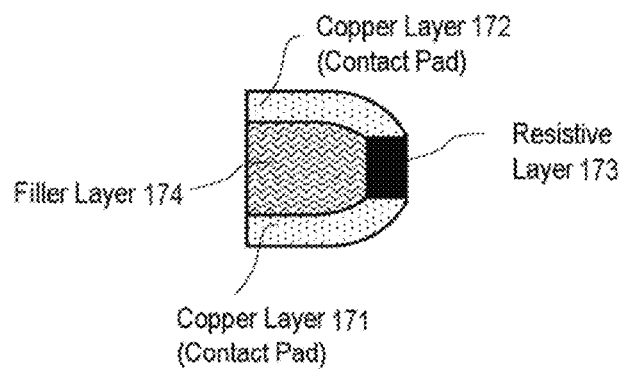
FIG. 4 shows an enlarged cross-sectional representation of the measurement resistor of FIG. 3.

FIG. 3 represents a further example of a power semiconductor module 1, having a measurement resistor 17 according to one example of the present invention. The structure of the measurement resistor 17 leads to an essentially vertical current flow direction through the measurement resistor 17 (in the case of a substrate surface extending in a horizontal plane). For this reason, the measurement resistor is also referred to as a "vertical shunt". FIG. 4 is an enlarged representation of the vertical shunt 17 of FIG. 3. The measurement resistor 17 comprises a lower metal layer 171, as well as an upper metal layer 172 arranged essentially parallel to the lower layer 171, the surfaces of which layers are respectively used for contacting the measurement resistor with the substrate metalization 12 or a bond wire 14. The metal layers 171 and 172 are for example made of copper, and may additionally be coated externally with a further metalization which ensures better solderability. On one side, the two metal layers 171 and 172 are electrically and mechanically connected by means of an intermediate region 173 made of a resistive alloy (resistive layer).

For example, the measurement resistor 17 may be made of a flat metal sheet, which consists of two copper parts 171 and 172 that are connected (for example by hard soldering) by an intermediate piece 173 made of resistive alloy. The metal sheet is then bent into a U-shape, so that the structure shown in FIG. 4 is obtained. The region between the two branches of the U-shape (i.e. between the metal layers 171 and 172) is filled with an insulating filler layer 174, so that the two branches of the U-shape are mechanically connected to one another rigidly and are not pliable (resilient). In an arrangement according to FIG. 4, the upper side of the metal layer 172 can be contacted well by means of ultrasonic bonding by virtue of the rigid filler layer 174.

Figure 5:
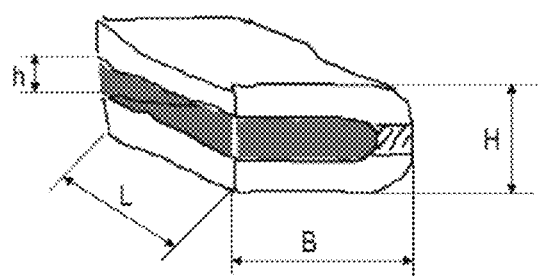
FIG. 5 shows a perspective representation of the measurement resistor of FIG. 3.

FIG. 5 shows a perspective representation of the measurement resistor 17. The measurement resistor has a height H of from 1 mm to 6 mm, a width B of from 0.5 mm to 10 mm (for example from 1.5 mm to 4 mm) and a length in the range of from 2 mm to 40 mm (for example from 4 mm to 15 mm). The thickness h of the filler layer 174 may be between 0.2 mm and 5 mm (for example from 0.3 mm to 2 mm). The thickness of the metal layers 171 and 172 is between 0.2 mm and 3 mm. The dimensions mentioned are to be understood as examples. The exact dimensioning depends on the specific application. Any conventional resistive alloys may be used as the resistive alloy for the resistive layer 173. Often used are nickel-chromium alloys with additives of aluminum, silicon, manganese and iron (for example Isaohm®), as well as copper-manganese-nickel alloys (for example Manganin®), copper-manganese-tin alloys (for example Zeranin®), iron-chromium-aluminum alloys (for example Aluchrom®) or the like. The filler layer may consist of plastic, which is either injected (in liquid form) into the intermediate region between the metal layers 171 and 172 or is subsequently pressed or adhesively bonded as a sheet (in solid form). Suitable plastics are both thermoplastics and thermosets, for example a polyimide (PI).

Figure 6:
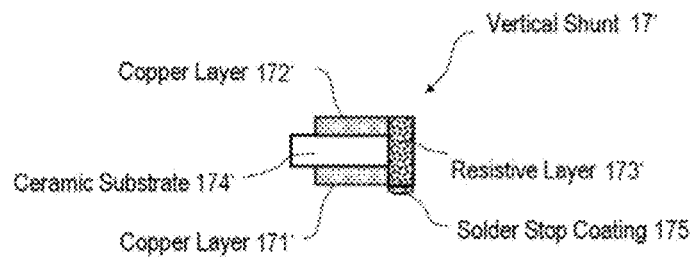
FIG. 6 shows an example of an alternative structure of the measurement resistor.
Figure 7:
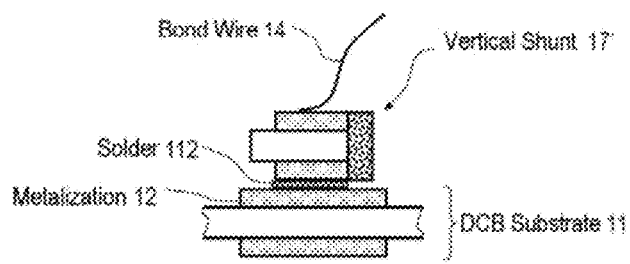
FIG. 7 shows an example of the fastening of the measurement resistor according to FIG. 6 on a power electronic substrate of a power semiconductor module.

As an alternative to plastic, ceramic may also be envisioned. Like plastic, ceramic may be pressed or adhesively bonded into the intermediate region between the metal layers 171 and 172. As an alternative, known copper-ceramic connection techniques may be envisioned, for example AMB (active metal brazing) and DCB (direct copper bonding). Manufacture by cold gas spraying would also be possible. FIGS. 6 and 7 represent a further exemplary embodiment of a measurement resistor (referred to in FIGS. 6 and 7 as a vertical shunt 17') according to the present invention. In this example, the measurement resistor 17' is made from a piece of DCB substrate or AMB substrate. In this case, copper layers 171' and 172' are respectively arranged on the two sides of a ceramic carrier 174' (which fulfills the same function as the filler layer 174 in the previous example). The DCB or AMB substrate is ground flat on one side (the end side, i.e. in a vertically extending plane), and the resistive material is fastened (for example welded) as a vertically extending layer 173' on the ground edge, so that the resistive layer 173' is respectively contacted at the upper and lower ends by a metal layer 171' and 172'. The finished measurement resistor 17' has essentially the same structure as the measurement resistor 17 of FIGS. 4 and 5.

FIG. 7 schematically shows the use of the measurement resistor in a power semiconductor module, of which for the sake of simplicity only a portion of the power electronic substrate 11 is represented. According to the example represented, the lower metal layer 171' of the measurement resistor 17' is connected by means of a solder layer 112 to the metalization 12 of the power electronic substrate 11. The upper metal layer 171' of the measurement resistor 17' is contacted, for example by means of ultrasonic bonding (bond wire 14). The lower side of the resistive layer 173' may be protected with a solder stop coating 175 before the soldering of the measurement resistor 17', in order to prevent direct soldering of the resistive layer 173' onto the metalization 12 (see FIG. 6).

Figure 8:
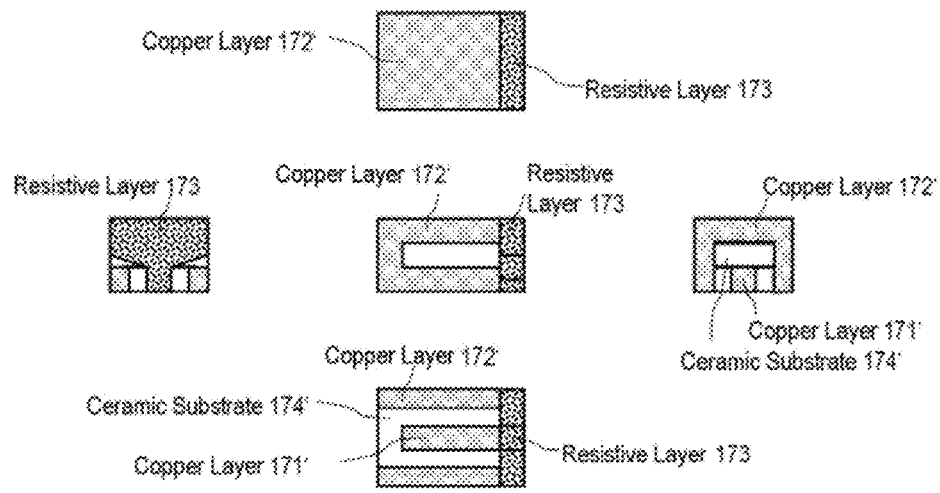
FIG. 8 shows a further example of an alternative embodiment of the measurement resistor.

FIG. 8 describes a further example of a structure according to the invention of a measurement resistor. It corresponds essentially to the structure from the previous example, but additionally comprises Kelvin contacts in order to allow a three-conductor measurement or a four-conductor measurement. FIG. 8 shows the present example in five different views. The central representation is a view from the front (like FIG. 6). On the left thereof is the view from the right. The right-hand representation is that from the left. The upper representation shows the plan view of the bonding surface. The lower representation shows the view from below with the solder contacts. In the present example, a ceramic substrate 174' is used as the interlayer—as in the example of FIG. 6. Other insulating carrier layers are, however, also possible. Arranged on the upper side of the ceramic substrate 174', there is a copper layer 172' which is also used as a bonding surface (bond pad) (cf. FIGS. 3 and 7). Arranged on the lower side of the ceramic substrate 174', there is a further copper layer 171', which is used as a solder contact (cf. FIGS. 3 and 7). The two layers 171' and 172' are conductively connected by means of the resistive layer 173, the resistive layer being arranged laterally on the ceramic substrate 174' so that, during operation, the load current flows essentially in a vertical direction through the resistive layer 173 (from the layer 171' to the layer 172', or vice versa). Besides the main current path, which is formed by the resistive layer 173, the copper layer 172' provides a further current path from the upper side of the ceramic substrate 174' to its lower side. To this end, one or more parts of the layer 172' extend from the upper side of the ceramic substrate 174' via a side surface of the ceramic substrate 174' to the lower side of the latter. On the lower side, the layer 172' is separated and insulated from the layer 171'. The two metal layers 171' and 172' thus have, on the lower side of the ceramic substrate 174', two insulated contact surfaces which can be connected to corresponding contact surfaces of a power semiconductor substrate 11 (for example by soldering, cf. FIG. 3). The second metal layer 172' can thus be connected to a power semiconductor on the one hand substrate 11 directly by soldering and, on the other hand, indirectly by a bond wire that contacts the metal layer 172' on the upper side of the resistor. In this way, a three-conductor or a four-conductor measurement on the measurement resistor is possible. Furthermore, the thermal connection of the upper side of the measurement resistor and the power substrate 11 is improved.

What is claimed is:

1. A measurement resistor, comprising:
   a first metal layer arranged in a first plane;
   a second metal layer arranged in a second plane that is parallel to the first plane and separated from the first plane;
   an electrically insulating interlayer arranged between the first and second metal layers and which mechanically connects the first and second metal layers to one another; and
   a resistive layer which electrically connects the first and second metal layers to one another,
   wherein the first metal layer, the second metal layer, and the resistive layer form a U-shaped structure, wherein the U-shaped structure is configured to be placed on a planar surface with the first metal layer lying flush against the planar surface and physically supporting the measurement resistor and the second metal layer being vertically spaced apart from the first metal layer.

2. The measurement resistor of claim 1, wherein a current flow direction through the resistive layer during operation extends substantially perpendicularly to the first and second planes.

3. The measurement resistor of claim 1, wherein the metal layers consist of copper or a copper alloy, and/or wherein the interlayer consists of plastic or ceramic.

4. The measurement resistor of claim 1, wherein the resistive layer consists of a resistive alloy that comprises at least two of the following metals: copper; manganese; tin; nickel; iron; chromium; and aluminum.

5. The measurement resistor of claim 1, wherein the first and second metal layers are formed by metalizations of a DCB substrate, a DAB substrate or an AMB substrate, and wherein the resistive layer is arranged laterally on the substrate in such a way that the resistive layer electrically connects the metalizations of the substrate.

6. The measurement resistor of claim 1, wherein the second metal layer extends along a side surface of the interlayer into the first plane, and wherein the first and second metal layers have, in the first plane, two contact surfaces electrically insulated from one another, which can be connected to corresponding contact surfaces of a substrate.

7. The measurement resistor of claim 1, wherein the electrically insulating interlayer completely fills a central region of the U-shaped structure.

8. A method for producing a measurement resistor, the method comprising:
   providing an approximately U-shaped structure, two approximately parallel branches of the U-shape structure forming two metal layers which are separated from one another and parallel to one another and which are electrically connected to one another by a resistive layer; and
   arranging an interlayer made of insulating material between the parallel branches of the U-shape, so that the insulating material mechanically connects the two parallel branches of the U-shape,
   wherein the U-shaped structure is configured to be placed on a planar surface with the first metal layer lying flush against the planar surface and physically supporting the measurement resistor and the second metal layer being vertically spaced apart from the first metal layer.

9. The method of claim 8, further comprising:
   injecting liquid plastic into the region between the parallel branches of the U-shape, so that the plastic mechanically connects the two parallel branches of the U-shape.

10. The method of claim 8, further comprising:
    pressing solid plastic or ceramic into the region between the parallel branches of the U-shape, so that the solid plastic or ceramic mechanically connects the two parallel branches of the U-shape.

11. The method of claim 8, further comprising:
    adhesive bonding solid plastic or ceramic into the region between the parallel branches of the U-shape, so that the solid plastic or ceramic mechanically connects the two parallel branches of the U-shape.

12. A method for producing a measurement resistor, the method comprising:
    providing a power electronic substrate having an insulation carrier made of ceramic or insulated metal and metalization on both sides; and
    fixing a resistive layer on a side surface of the power electronic substrate, so that the resistive layer connects the metalizations,
    wherein the metalization on both sides and the resistive layer form a U-shaped structure, wherein the U-shaped structure is configured to be placed on a planar surface with a first one of the metalizations lying flush against the planar surface and physically supporting the measurement resistor and a second one of the metalizations being vertically spaced apart from the first metalization.

13. The method of claim 12, wherein before fixing the resistive layer on a side surface of the power electronic substrate, this side surface is ground flat.

14. The method of claim 12, wherein fixing the resistive layer on a side surface of the power electronic substrate is carried out by welding.

15. A power semiconductor module, comprising:
    a power electronic substrate having a structured metalization, which comprises a plurality of contact pads;
    at least one electronic component arranged on the power electronic substrate;
    a measurement resistor, which comprises:
    a first metal layer is arranged on one of the contact pads of the structured metalization and mechanically and electrically connected to that contact pad;
    a second metal layer arranged in a plane parallel to the structured metalization and separated from the structured metallization;
    an electrically insulating interlayer arranged between the first and second metal layers and which mechanically connects the first and second metal layers to one another; and
    a resistive layer which electrically connects the first and second metal layers to one another,
    wherein the first metal layer, the second metal layer, and the resistive layer form a U-shaped structure, wherein the U-shaped structure is configured to be placed on a planar surface with the first metal layer lying flush against the planar surface and physically supporting the measurement resistor and the second metal layer being vertically spaced apart from the first metal layer.

16. The power semiconductor module of claim 15, further comprising:

a bond wire connected to the second metal layer by an ultrasonic bond connection so that the bond wire electrically contacts the measurement resistor.

* * * * *